United States Patent
Mazure-Espejo et al.

(10) Patent No.: US 6,414,300 B1
(45) Date of Patent: Jul. 2, 2002

(54) CIRCUIT WITH A SENSOR AND NON-VOLATILE MEMORY HAVING A FERROELECTRIC DIELECTRIC CAPACITOR

(75) Inventors: Carlos Mazure-Espejo, München; Christoph Zeller, Ottobrunn, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/674,628
(22) PCT Filed: Mar. 26, 1999
(86) PCT No.: PCT/DE99/00924
   § 371 (c)(1),
   (2), (4) Date: Feb. 5, 2001
(87) PCT Pub. No.: WO99/57726
   PCT Pub. Date: Nov. 11, 1999

(30) Foreign Application Priority Data

Apr. 30, 1998 (DE) .......................................... 198 19 542

(51) Int. Cl.⁷ .............................................. H01L 31/00
(52) U.S. Cl. ................................. 250/214.1; 250/208.1
(58) Field of Search .......................... 250/214.1, 214 R, 250/214 LS, 208.1, 214 P; 356/218, 222–226; 257/290, 291; 348/294, 295, 297, 298

(56) References Cited

U.S. PATENT DOCUMENTS

4,162,402 A * 7/1979 Hopper ........................ 250/332
5,325,050 A * 6/1994 Sameshima ............. 324/103 P
5,332,962 A * 7/1994 Sameshima ............. 324/103 P

FOREIGN PATENT DOCUMENTS

EP     0403248 A2 * 12/1990
EP     0486901 A2 * 5/1992

* cited by examiner

*Primary Examiner*—Que T. Le
(74) *Attorney, Agent, or Firm*—Laurence A. Greenberg; Werner H. Stemer; Ralph E. Locher

(57) ABSTRACT

A circuit includes a sensor delivering a charge, a capacitor non-volatilely storing the charge, and a read and reset circuit reading out the stored charge. The capacitor has further connection terminals connected to the read and reset circuit and in parallel with the sensor terminals, and a ferroelectric storage dielectric intermittently connected to the sensor. The sensor can be a photodiode, a phototransistor, a Hall sensor, or a thermoelement. A switch can be connected between one of the further terminals and one of the sensor terminals. Preferably, the switch is a transistor and a drive circuit drives it. The sensor and the capacitor are formed in a semiconductor body. During a storage procedure, time periods during which the switch is on are coordinated with the sensor and/or capacitor to keep an electrical field present between the further terminals below a maximum value at which the ferroelectric dielectric saturates.

14 Claims, 3 Drawing Sheets

CIRCUIT WITH A SENSOR AND NON-VOLATILE MEMORY HAVING A FERROELECTRIC DIELECTRIC CAPACITOR

BACKGROUND OF THE INVENTION

FIELD OF THE INVENTION

The present invention relates to a circuit arrangement having a sensor and a storage means for the nonvolatile storage of a charge delivered by the sensor.

Sensors are used for recording nonelectric variables and for conversion to variables which can be measured electrically, such as current, voltage or electrical charge. Nonvolatile storage of the charge delivered by the sensor has hitherto been associated with considerable complexity. As an example, CCD cameras should be mentioned in this regard, said cameras having a multiplicity of light-sensitive sensors which are arranged in a similar manner to a matrix and at which an electrical charge is generated when light is incident, The charges generated at the individual sensors are read out and converted in an amplifier unit to voltages which can be used for programming nonvolatile memory cells, such as flash EEPROMs. Besides the high level of circuit complexity, the provision of a high supply voltage suitable for programming the EEPROMs and the relatively large space requirement, which arises as a result of the provision of an amplifier circuit and the physically separate arrangement of the sensor matrix and the storage means, a particular disadvantage of such apparatuses is that the aforementioned nonvolatile memories only permit digital values to be stored.

If, by way of example, in the case of light sensors, the amount of charge generated by the sensors is dependent on brightness, part of the brightness information is inevitably lost when this charge is stored using the aforementioned storage means. If each sensor has only one associated memory cell, the stored value can be used only to distinguish whether the brightness at the sensor was above or below a prescribed threshold value More exact storage of the analog value delivered by the sensor requires analog/digital conversion of this analog value and storage of the digital value obtained in this process, the number of memory cells required for storing the digital value depending on the number of places in the digital value.

U.S. Pat. Nos. 5,325,050 and 5,332,962 describe circuit arrangements having a sensor and a storage means for the nonvolatile storage of a charge delivered by the sensor, the storage means being a capacitor having a ferroelectric storage dielectric which is at least intermittently connected to the sensor element.

SUMMARY OF THE INVENTION

The circuit arrangements described also have a DC voltage source which is intermittently connected to the ferroelectric capacitor in order to produce spontaneous polarization of the dielectric, and a polarization detector to establish whether the polarization of the ferroelectric capacitor has changed on account of a voltage signal delivered by the sensor.

In this way, as in the aforementioned circuit arrangements described, it is only possible to establish whether a prescribed maximum value for the sensor signal has been exceeded This case therefore also presents only analog/digital conversion of an analog sensor signal.

The document EP 0 402 248 A2 relates to a photosensor having an analog store connected. The way in which such a circuit arrangement can be produced easily and the means used to do so are not disclosed.

The present invention was therefore based on the object of providing a circuit arrangement having a sensor and a storage means which easily permits the storage and evaluation of analog values delivered by the sensor, which can be produced as an integrated circuit arrangement, in particular, and for which the aforementioned disadvantages do not arise.

This aim is achieved by the circuit arrangement mentioned in the introduction, in which the storage means is a capacitor having a ferroelectric storage dielectric which is at least intermittently connected in parallel with connection terminals of the sensor.

The capacitor having the ferroelectric storage dielectric permits nonvolatile storage of the charge delivered by the sensor. The capacitor is connected to the sensor, possibly via a switch. This means that it is possible to integrate the sensor and the capacitor in the same semiconductor body, the result of which is a very small space requirement for producing the circuit arrangement according to the arrangement. The matrix-like arrangement of an appropriately large number of light-sensitive sensors, such as photodiodes, which each have an associated capacitor with a ferroelectric storage dielectric, thus permits all the components necessary for detecting and storing images to be accommodated on one chip.

The present invention is not restricted to the use of light-sensitive sensors, however. Instead, it can be used anywhere where the use of sensors and storage of the values delivered by the sensors are required and where the smallest possible physical form is desirable, such as in micromechanics.

Advantageous refinements of the invention are the subject-matter of the dependent claims.

To store the charge delivered by the sensor, the sensor can be permanently connected in parallel with the connection terminals of the sensor by means of a fixed line connection. By way of example, when the circuit arrangement according to the invention is used for image detection, this is a preferred embodiment if an aperture is provided in front of the light sensors which permits the light sensors to be only intermittently exposed to light. If the light sensors are in the form of photodiodes, an approximately constant voltage drops between the connection terminals thereof upon exposure to light, the current delivered by the sensors or the charge delivered to the capacitors per unit time depending on the light intensity at the respective light sensor. The charges delivered by the individual sensors and stored at least in part in the capacitors thus represent a measure of the mean illuminance at the sensor while the aperture is open. The capacitors thus store an item of image information, the resolution of the image resulting from the number of light sensors arranged in matrix form.

In one embodiment of the invention, a switch, in particular in the form of a transistor, is connected between a terminal of the capacitor and a connection terminal of the sensor element. In this case, the switch fulfills the function of the aforementioned aperture. Turning on the switch determines the instant at which the charge generated by the sensor or sensors is to be stored in the capacitor or capacitors.

Preferably, for reading out the charge stored in the capacitor, a read and reset circuit connected to at least one terminal of the capacitor is provided.

The design and manner of operation of the circuit arrangement according to the invention are explained in more detail below with the aid of illustrative embodiments in the figures of the drawings.

BRIEF DESCRIPTION OF THE DRAWINGS

Unless otherwise stated, the same reference symbols denote the same components with the same meaning in the figures.

DESCRIPTION OF THE PREFERRED EMBODIMENT

Figure 1:
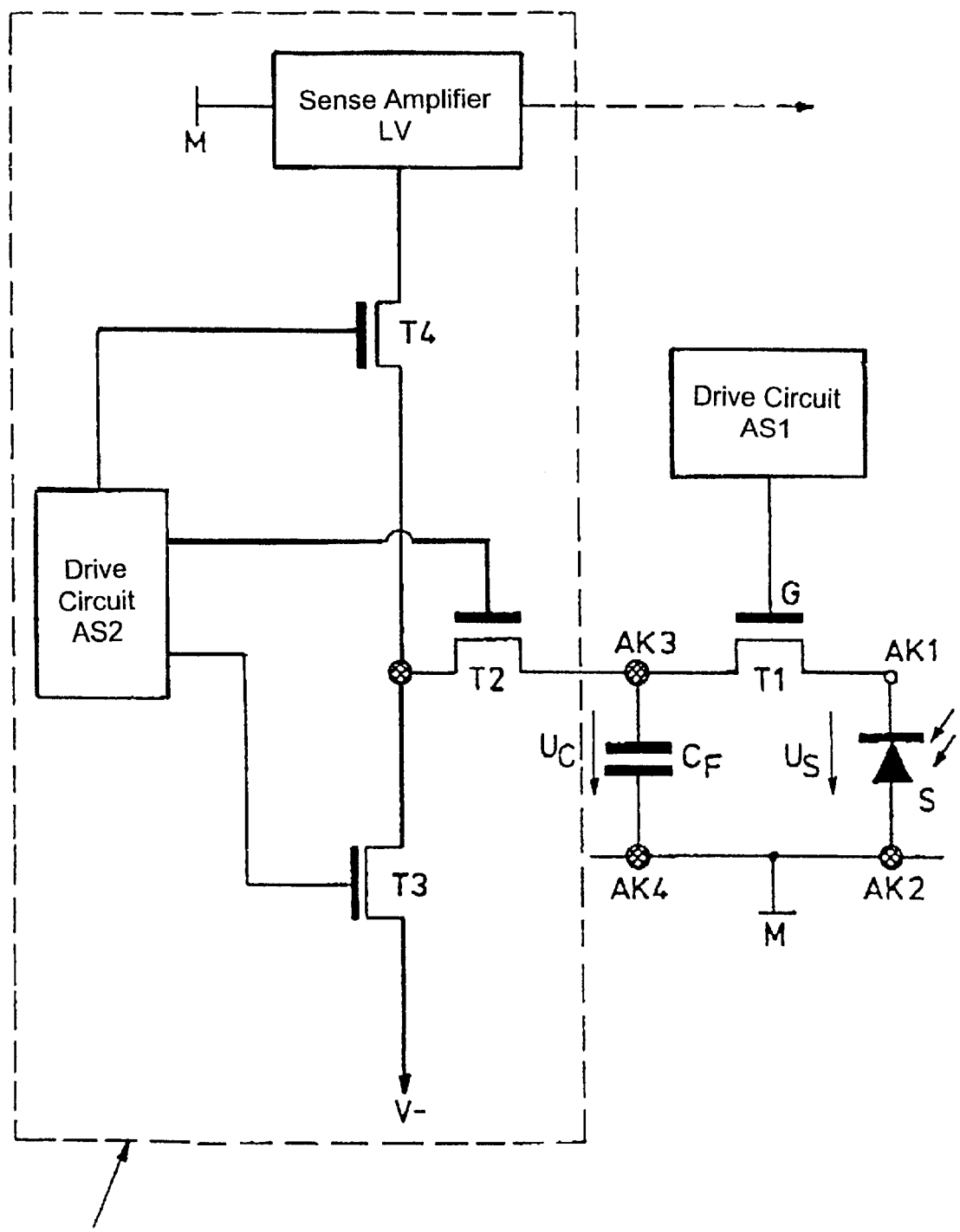
FIG. 1 shows a circuit diagram of an embodiment of the circuit arrangement according to the invention.

FIG. 1 shows a circuit diagram of the inventive circuit arrangement having a sensor S and a capacitor $C_F$ which has a ferroelectric storage dielectric. The capacitor $C_F$ and the sensor S, which is in the form of a photodiode in the example illustrated, are each connected to a common reference-ground potential M by means of a connection terminal AK2, AK4. Another connection terminal AK3 of the capacitor $C_F$ is connected to another connection terminal AK1 of the sensor S via the load path of a field effect transistor T1 acting as a switch. To drive the transistor T1, there is a first drive circuit AS1, which is connected to the gate connection G of the transistor T1 and, by driving the transistor T1, determines the instant and the length of time for which there is a conductive connection between the capacitor $C_F$ and the sensor S.

The manner of operation of the circuit arrangement will be described below for the use of a photodiode as sensor S.

When light is incident on the photodiode S, an approximately constant voltage drops between the connection terminals AK1, AK2 thereof, the current delivered by the photodiode S being dependent on the intensity of the incident light.

The use of a ferroelectric dielectric in the capacitor $C_F$ permits at least some of the charge flowing from the photodiode S to the capacitor $C_F$ when the transistor T1 is on to be permanently stored. The phenomenon of this permanent charge storage is explained with the aid of the hysteresis curve shown in FIG. 2, which shows the profile for an electrical field $E_i$ forming inside the ferroelectric dielectric as a function of an external electrical field $E_e$ applied to capacitor plates—between which the dielectric is situated. This external electrical field $E_e$ is dependent on the voltage $U_c$ present between connection terminals of the capacitor $C_F$.

When an external electrical field $E_e$ is present, an internal field $E_i$ is formed in the ferroelectric dielectric, the values of said internal field being situated on curve sections K1, K2 with different profiles, depending on whether the external electrical field $E_e$ increases toward positive values starting from a negative value $-E_{emax}$ or whether the external electrical field $E_e$ decreases toward negative values starting from a positive value $E_{emax}$. After a point on the hysteresis curve, denoted as lower saturation point D, the curve sections K1 and K2 run together when the amount of the negative external electrical field exceeds the value $E_{emax}$. Likewise, the curve sections K1, K2 run together after an upper saturation point B when the amount of the positive external electrical field $E_e$ exceeds the value $E_{emax}$.

Figure 2:
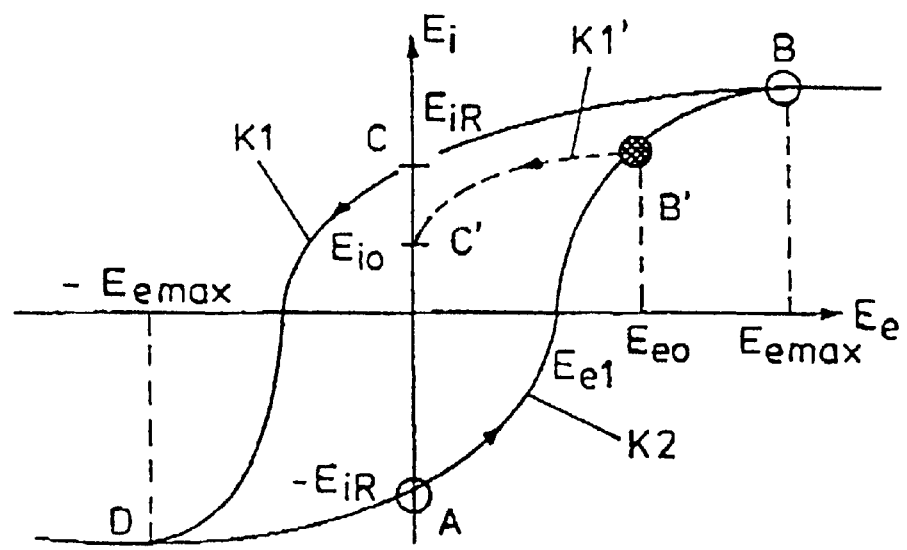
FIG. 2 shows a curve for the electrical field $E_i$ in the ferroelectric storage dielectric as a function of the electrical field $E_e$ applied to the capacitor externally.

If applying a negative external electrical field $E_e$ sweeps through the hysteresis curve as far as the lower saturation point D and turns off the external electrical field $E_e$ or a voltage present on the capacitor terminals AK3, AK4, a negative internal electrical field with the value $-E_{iR}$ is maintained in the storage dielectric, as becomes clear from FIG. 2 at point A on the hysteresis curve. If the hysteresis curve is swept through as far as the upper saturation point B as a result of a positive external electrical field being applied, a positive internal electrical field with the value $E_{iR}$ remains in the storage dielectric after the external field has been turned off, as becomes clear at point C on the hysteresis curve.

The internal electrical field $E_i$ which remains after the external electrical field $E_e$ has been removed results from permanent polarization of the ferroelectric dielectric, the extent of the polarization and hence the strength of the internal electrical field depending on the value of the external electrical field $E_e$ applied beforehand. If, for example as a result of a smaller positive external electrical field $E_e$ being applied, the hysteresis curve is swept through only as far as point B', weaker polarization of the dielectric takes place, so that a smaller internal electrical field with the value $E_{iO}$ remains after removal of the external electrical field $E_e$. Increasing the magnitude of the negative or positive external electrical field $E_e$ beyond $E_{emax}$ or beyond the saturation points D and B causes no increase in the magnitude of the internal electrical field $E_i$ which remains after the external electrical field $E_e$ has been turned off.

The internal electrical field $E_i$ which remains after removal of the external electrical field $E_e$ as a result of polarization of the dielectric has permanent charge storage on the capacitor plates of the capacitor $C_F$ associated with it, the value of the stored charge depending on the value of the internal electrical field and hence on the external electrical field $E_e$ applied in order to store the charge or on the voltage $U_c$ present between the capacitor terminals AK3, AK4.

The cycle of a storage procedure will be explained below, the sensor S being assumed, by way of example, to be a photodiode which, when light is incident, generates an approximately constant positive voltage between its connection terminals AK1, AK2 and hence, when connected in parallel with the capacitor $C_F$, produces a positive external electrical field between the capacitor plates. The photodiode delivers a current which is dependent on the illuminance; the brightness information is thus mapped onto the current delivered by the sensor.

Before a charge delivered by the sensor S is stored, the capacitor $C_F$ is "reset". This is done by applying a negative voltage, as a result of which the hysteresis curve shown in FIG. 2 is swept through as far as the lower saturation point D. The negative voltage can be applied, as shown in FIG. 1, by connecting the connection terminal AK3 of the capacitor $C_F$ to a terminal for a potential V− which is negative with respect to the reference-ground potential M. As explained above, a negative internal electrical field with the value $-E_{iR}$ remains in the storage dielectric after the negative voltage has been turned off.

If the capacitor $C_F$ is subsequently connected in parallel with the sensor S as a result of the transistor T1 turning on, when light is incident on the sensor S a charge generated by the sensor S flows to the capacitor plates of the capacitor $C_F$.

This charge causes an external electrical field $E_e$, which in turn causes the value of the internal electrical field $E_i$ to rise from the value $-E_{iR}$ at point A on the hysteresis curve in accordance with the curve profile for the curve section K2 toward the upper saturation point B. After the transistor T1 has turned off, no further charge flows to the capacitor $C_F$. The voltage $U_c$ established between the capacitor terminals by the flow of charge, or the external electrical field $E_e$, is maintained at first after the switch T1 has turned off. However, unavoidable leakage currents cause some of the charge stored on the capacitor plates to flow away until the external electrical field $E_e$ becomes zero. Remaining permanently stored on the capacitor plates is that part of the charge which results from the internal electrical field $E_i$ remaining after removal of the external electrical field $E_e$. If no light is incident on the photodiode S and hence no charge flows to the capacitor $C_F$, the internal electrical field remains at the value $-E_{iR}$.

The capacitor is suitable both as an analog storage medium and as a digital storage medium. To use it as an analog storage medium, it is necessary to ensure that the external electrical field $E_e$ assumes values between 0 and less than $E_{emax}$ after the capacitor has been reset, and the internal electrical field $E_i$ then assumes values between $-E_{iR}$ and $E_{iR}$ after removal of the external electrical field. The charge permanently stored on the capacitor plates is proportional to the remaining internal electrical field $E_i$ and hence is dependent on the external electrical field $E_e$ which is present on the capacitor for storage, The value of the external electrical field is dependent on the charge flowing to the capacitor plates when the transistor T1 is on, the external electrical field $E_e$ and the charge Q which flows to the capacitor plates having the following relationship:

$$E_e = Q/(A \cdot \in),$$

where A denotes the capacitor surface area and $\in$ denotes the dielectric constant of the storage dielectric.

On the other hand, the charge flowing to the capacitor plates depends on the voltage produced between the connection terminals AK1, AK2 of the sensor S and on the length of time for which the turned-on transistor permits a flow of charge. The parameters capacitor surface area A, voltage drop $U_s$ on the sensor and turned-on time of the transistor T1 are coordinated with one another, for the purpose of storing analog values, such that the value of the positive external electrical field always assumes values less than or equal to $E_{emax}$. Thus, by way of example, increasing the size of the capacitor surface area can slow down the rise in the external electrical field $E_e$ when the flow of current is constant, and hence can increase the sensitivity of the arrangement. In addition, the capacitor surface areas need to be chosen such that the capacitor $C_F$ does not saturate immediately when charge is delivered by the sensor S when the transistor T1 is on.

In accordance with a first embodiment, the sensor S and the capacitor $C_F$ are coordinated with one another such that the voltage produced on the sensor $U_s$ is sufficient to bring the capacitor to the upper saturation point, that is to say the sensor S produces an external field $E_e$ whose value is greater than or equal to $E_{emax}$ when the transistor T1 is on for long enough. When a photodiode is used, the brightness information is mapped onto the current delivered by the photodiode. Since the capacitor $C_F$ can only hold a particular amount of charge before it saturates, the transistor T1 only permits a flow of current for a prescribed length of time, which means that the charge stored in the capacitor $C_F$ can be used to draw conclusions about the current flowing for storage and hence about the brightness information on the sensor. The length of time for which the transistor T1 is on is equivalent to the aperture time in photographic equipment. Thus, the arrangement according to the invention also permits the aperture time to be reduced for high illuminance, in order to prevent saturation of the capacitor $C_F$ as a result of the large charging current delivered by the sensor S for a high level of brightness.

In a further embodiment, a sensor is used which delivers different voltage values between its output terminals AK1, AK2, depending on the brightness. The brightness values on the sensor are thus mapped onto different voltage values on the sensor. These different voltage values produce different values for the external electrical field $E_e$ on the capacitor $C_F$, the sensor being chosen such that the voltages between its connection terminals produce no values for the external electrical field greater than $E_{emax}$ in order to store analog values. In this embodiment, the length of time for which the transistor is on may be very long, or the transistor T1 may be dispensed with.

To use the capacitor as a digital storage medium, the sensor S and the capacitor surface area A of the capacitor $C_F$ are coordinated with one another such that the capacitor $C_F$ always saturates when it is connected in parallel with the sensor S and the sensor delivers a charging current as a result of exposure to light. The sensor S is preferably in the form of a photodiode for this embodiment, the voltage $U_s$ produced between its connection terminals AK1, AK2 when light is incident being sufficient to saturate the capacitor. So that the capacitor is always saturated when a charging current flows, a very small capacitor surface area A and long turned-on times for the transistor T1 are chosen, for example.

For reading out the charge stored in the capacitor $C_F$ by means of the sensor S, a read and reset circuit LRS is provided. The read and reset circuit LRS has a sense amplifier LV which is connected to the first connection terminal AK3 of the capacitor $C_F$ via the load paths of third and fourth transistors T2, T4. The transistors T2, T4 are driven by means of a second drive circuit AS2, which turns on the transistors T2, T4 for the purpose of reading out the charge stored in the capacitor $C_F$.

Once the reading procedure has ended, the capacitor $C_F$ is reset, the first connection terminal AK3 of the capacitor $C_F$ being connected to the terminal for negative potential V− via the load path of the transistor T2 and the load path of a further transistor T3, which can likewise be driven by the second drive circuit AS2. Once the read and reset procedure has ended, the transistor T2 is turned off under the control of the drive circuit AS2.

Figure 3:
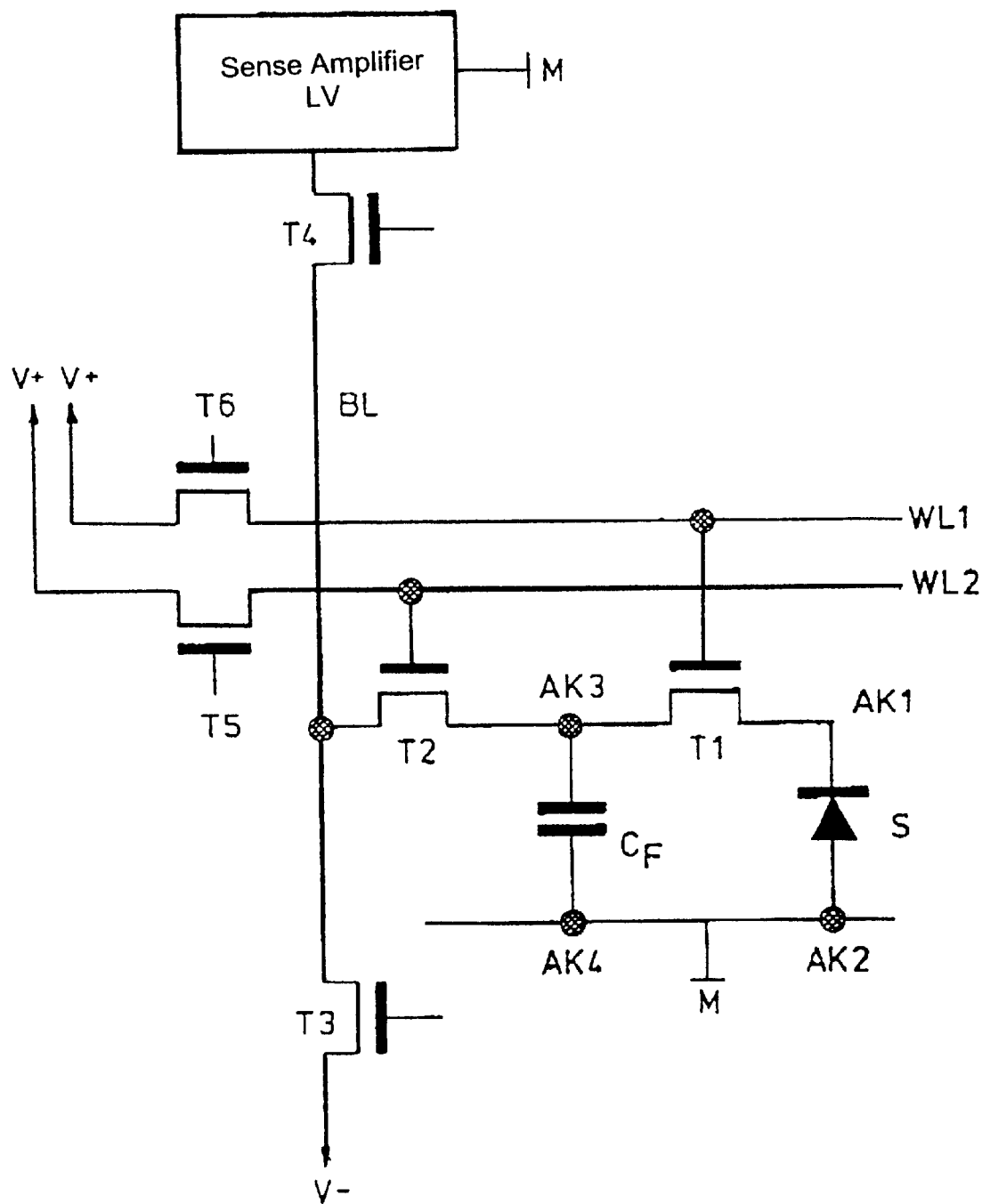
FIG. 3 shows a circuit arrangement according to the invention having external wiring when a number of sensors and capacitors in a matrix-like sensor and storage arrangement are used.

FIG. 3 shows the inventive circuit arrangement having the sensor S, the capacitor $C_F$ and the transistor T1, connected between connection terminals AK1, AK3 of the sensor S and of the capacitor $C_F$, as part of a matrix-like arrangement of such a sensor and storage arrangement, which each have a sensor S and a capacitor $C_F$. Each sensor and storage unit is connected to one bit line BL and to in each case two word lines WL1, WL2, each sensor and storage unit being unambiguously identifiable using the bit lines BL and word lines WL1, WL2 to which it is connected. Thus, no two sensor and storage arrangements are connected to the same bit lines and word lines BL, WL1, WL2. A first word line WL1 is used to drive the transistor T1 arranged between the sensor S and the capacitor $C_F$, the first word line WL1 being able to be connected by means of a transistor T6 to a drive potential V+ which is sufficient to turn on the first transistors T1. The transistor T6 is driven by means of a drive circuit (not shown in more detail here), the operation of this drive circuit being equivalent to that of the first drive circuit AS1 (shown in FIG. 1), since the first transistors are on for as long as the transistor T6 is on and the first word line WL1 is thus at drive potential V+ When the transistor T6 is driven, all the first transistors T1 connected to the first word line WL1 are turned on in order to store a charge generated by the sensors S on the capacitors $C_F$.

In addition, a second word line WL2 is provided which is connected to control connections of the second transistors T2 in the sensor and storage arrangements. The second word line WL2 can be connected to a terminal for drive potential V+ via a transistor T5, the second transistors T2 being on when the transistor T5 is on and the word line WL2 is at drive potential V+. The transistor T5 is driven by means of a drive circuit (not shown in more detail here). The bit line BL has a third and a fourth transistor T3, T4, whose operation is equivalent to that of the transistors T3, T4 shown in FIG. 1. These transistors T3, T4 are driven by means of a drive circuit (not shown in more detail here), the fourth transistor T4 being on when the second transistor T2 is also on and the charge stored in the capacitor $C_F$ is to be read out by means of the sense amplifier LV. The third transistor T3 is on when the second transistor T2 is also on, in order to reset the capacitor $C_F$ as a result of connection to the negative potential V−.

In the illustrative embodiment shown, the sense amplifier LV is used both for reading out the charge stored in the capacitors $C_F$ and for amplifying and forwarding the ascertained value to further processing units.

Figure 4:
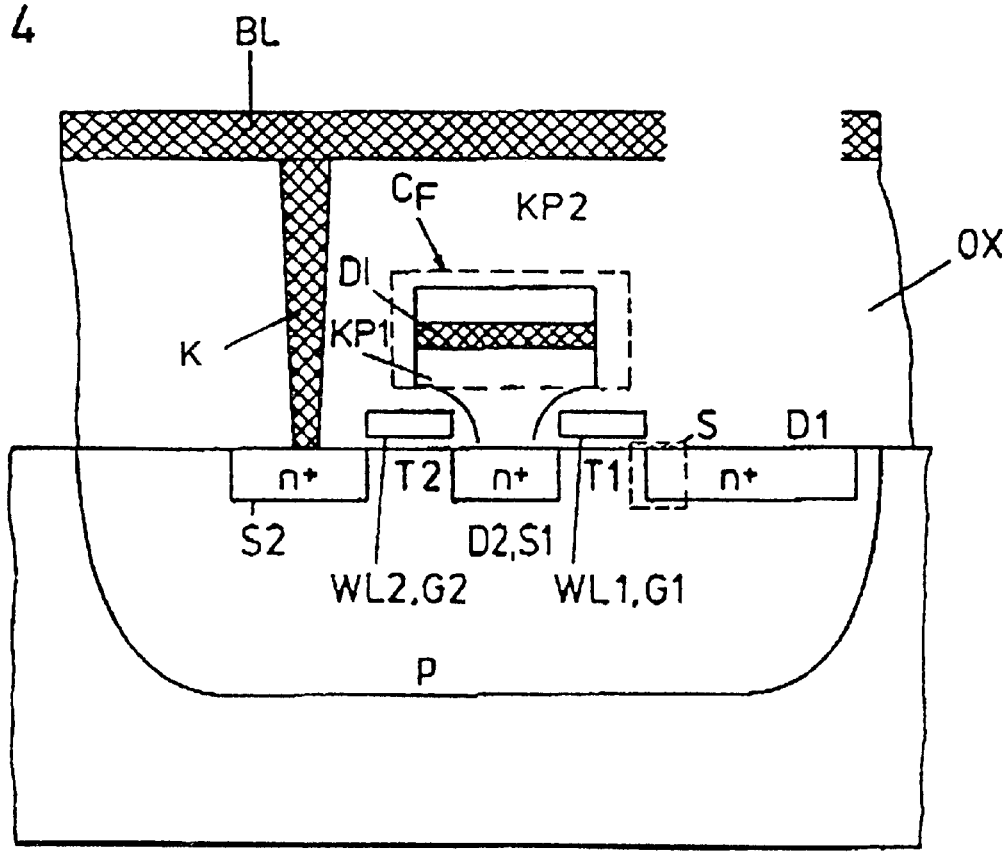
FIG. 4 shows a cross section through an inventive circuit arrangement integrated in a semiconductor body.

FIG. 4 shows a cross section through a semiconductor body containing a sensor and storage arrangement having a sensor S, a first transistor T1, a capacitor $C_F$ and a second transistor T2. In this embodiment, a p-doped well is doped into a silicon substrate SI. The transistors T1, T2 are in the form of n-channel CMOS transistors, the drain/source regions of the transistors T1, T2 being in the form of n+-doped regions in the p-doped well. In FIG. 4, the reference symbols G1, G2 denote the gate electrodes, the reference symbols S1, S2 denote the source regions and the reference symbols D1, D2 denote the drain regions of the transistors T1, T2. The first and second transistors T1, T2 have a common drain/source region D2, S1 which is connected to a first capacitor plate KP1 of the capacitor $C_F$ above the silicon substrate SI.

Arranged between the first capacitor plate KP1 and a second capacitor plate KP2 above the latter is a ferroelectric dielectric D1. The source region S2 of the second transistor T2 is connected to a bit line BL via a contact K so as to be electrically conductive. The gate electrodes G1, G2 of the first and second transistors T1, T2 simultaneously form the first and second word lines WL1, WL2, the bit line BL and the word lines WL1, WL2 running approximately at right angles to one another in the arrangement shown.

The sensor in the form of a light-sensitive diode in this illustrative embodiment is formed by the pn junction between the n+-doped region D1, which simultaneously represents the drain region D1 of the first transistor T1, and the p-doped well. In order to permit light to be incident on the n+-doped region D1, the bit line BL is moved past the sensors S and the insulation layer OX applied above the silicon substrate SI is designed to be translucent or permeable to radiation. Advantageously, the insulation layer OX is thinned above the n+-doped region D1 in order-to permit improved incidence of light.

The second capacitor plates KP2 of all the sensor and storage arrangements are preferably in the form of continuous electrode plates which are connected to a reference-ground potential.

We claim:

1. A circuit, comprising:

a sensor for delivering a charge, said sensor having connection terminals;

a capacitor for non-volatile storage of said charge delivered by said sensor, said capacitor having:
further connection terminals connected in parallel with said connection terminals; and
a ferroelectric storage dielectric at least intermittently connected to said sensor; and a read and reset circuit connected to said further connection terminals for reading out said charge stored in said capacitor.

2. The circuit according to claim 1, wherein said sensor is a photodiode.

3. The circuit according to claim 1, wherein said sensor is a phototransistor.

4. The circuit according to claim 1, wherein said sensor is a Hall sensor.

5. The circuit according to claim 1, wherein said sensor is a thermoelement.

6. The circuit according to claim 1, including a switch connected between one of said further connection terminals of said capacitor and one of said connection terminals of said sensor.

7. The circuit according to claim 6, wherein said switch is a transistor and a drive circuit drives said transistor.

8. The circuit according to claim 1, including a semiconductor body, said sensor and said capacitor formed in said semiconductor body.

9. The circuit according to claim 6, wherein:

said ferroelectric dielectric saturates at a maximum value; and at least two of said sensor, said capacitor, and time periods during which said switch is on are coordinated with one another to keep an electrical field present between said further connection terminals of said capacitor below said maximum value during a storage procedure.

10. The circuit according to claim 1, wherein:

said ferroelectric dielectric saturates at a maximum value;

a switch is connected between one of said further connection terminals of said capacitor and one of said connection terminals of said sensor; and at least two of said sensor, said capacitor, and time periods during which said switch is on are coordinated with one another to keep an electrical field present between said further connection terminals of said capacitor below said maximum value during a storage procedure.

11. The circuit according to claim 6, wherein:

said ferroelectric dielectric saturates at a maximum value; and at least two of said sensor, said capacitor and time periods during which said switch is on are coordinated with one another to have an electrical field present between said further connection terminals of said capacitor reach said maximum value during a storage procedure.

12. The circuit according to claim 11, wherein at least two of said sensor, said capacitor and time periods during which said switch is on are coordinated with one another to have an electrical field present between said further connection terminals of said capacitor always reach said maximum value during a storage procedure.

13. The circuit according to claim 10, wherein:

said ferroelectric dielectric saturates at a maximum value;

a switch is connected between one of said further connection terminals of said capacitor and one of said connection terminals of said sensor; and at least two of said sensor, said capacitor and time periods during which said switch is on are coordinated with one another to have an electrical field present between said further connection terminals of said capacitor reach said maximum value during a storage procedure.

14. The circuit according to claim 13, wherein at least two of said sensor, said capacitor and time periods during which said switch is on are coordinated with one another to have an electrical field present between said further connection terminals of said capacitor always reach said maximum value during a storage procedure.

\* \* \* \* \*